US011202390B2

(12) United States Patent
Zhang et al.

(10) Patent No.: US 11,202,390 B2
(45) Date of Patent: Dec. 14, 2021

(54) HEAT DISSIPATION UNIT CONNECTION REINFORCEMENT STRUCTURE

(71) Applicant: ASIA VITAL COMPONENTS CO., LTD., New Taipei (TW)

(72) Inventors: Jian Zhang, New Taipei (TW); Han-Min Liu, New Taipei (TW)

(73) Assignee: ASIA VITAL COMPONENTS CO., LTD., New Taipei (TW)

( * ) Notice: Subject to any disclaimer, the term of this patent is extended or adjusted under 35 U.S.C. 154(b) by 0 days.

(21) Appl. No.: 16/897,274

(22) Filed: Jun. 10, 2020

(65) Prior Publication Data

US 2020/0305309 A1 Sep. 24, 2020

Related U.S. Application Data

(62) Division of application No. 15/972,233, filed on May 7, 2018, now abandoned.

(51) Int. Cl.
*H05K 7/20* (2006.01)
*F28D 15/02* (2006.01)
*F28D 15/04* (2006.01)
*H01L 23/427* (2006.01)

(52) U.S. Cl.
CPC ..... *H05K 7/20336* (2013.01); *F28D 15/0266* (2013.01); *F28D 15/0275* (2013.01); *F28D 15/04* (2013.01); *H01L 23/427* (2013.01)

(58) Field of Classification Search
CPC .. F28D 15/0275; F28D 15/0266; F28D 15/04; H05K 7/20336; H01L 23/427
See application file for complete search history.

(56) References Cited

U.S. PATENT DOCUMENTS

| | | | | | |
|---|---|---|---|---|---|
| 1,744,932 | A | * | 1/1930 | Swank | F28F 9/165 285/192 |
| 3,974,022 | A | * | 8/1976 | Lauro | F28F 9/06 165/178 |
| 4,120,352 | A | * | 10/1978 | Husson | F28F 21/006 165/178 |
| 5,216,580 | A | * | 6/1993 | Davidson | F28D 15/046 361/700 |
| 7,540,318 | B2 | * | 6/2009 | Nitta | F28D 15/046 165/104.26 |
| 10,126,069 | B2 | * | 11/2018 | Sun | F28D 15/046 |

* cited by examiner

*Primary Examiner* — Leonard R Leo
(74) *Attorney, Agent, or Firm* — Demian K. Jackson; Jackson IPG PLLC

(57) ABSTRACT

A heat dissipation unit connection reinforcement structure includes a case, at least one reinforcement structure and at least one heat pipe. The case has a case chamber and at least one opening formed through a top side of the case in communication with the case chamber. The reinforcement structure has a reinforcement main body correspondingly disposed on the opening. The reinforcement main body has a connection hole in communication with the case chamber, mating section and a reinforcement connection section. The heat pipe has a heat pipe chamber. One end of the heat pipe is inserted in the corresponding connection hole, whereby the heat pipe chamber is in communication with the case chamber. The inner circumference of the reinforcement connection section is tightly attached to and connected with an outer side of the corresponding heat pipe.

9 Claims, 6 Drawing Sheets

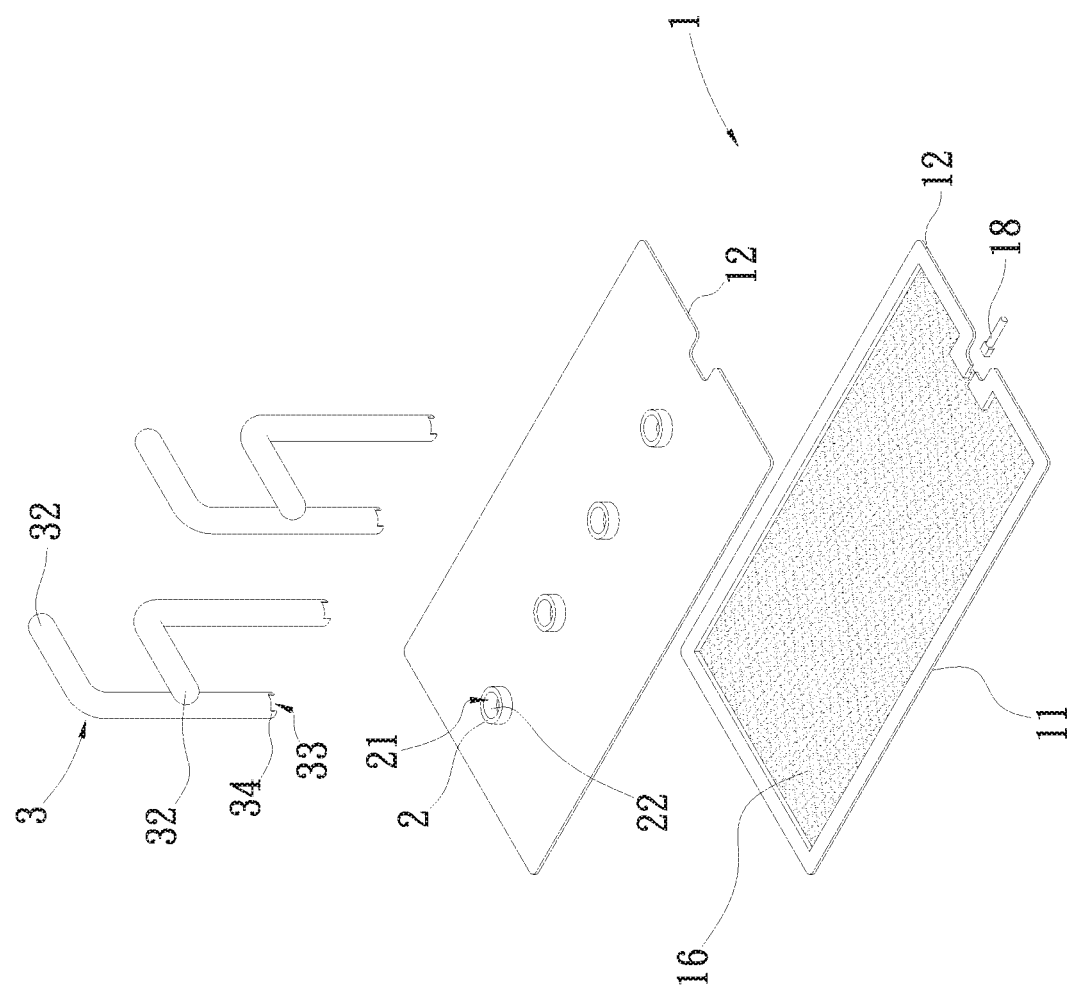

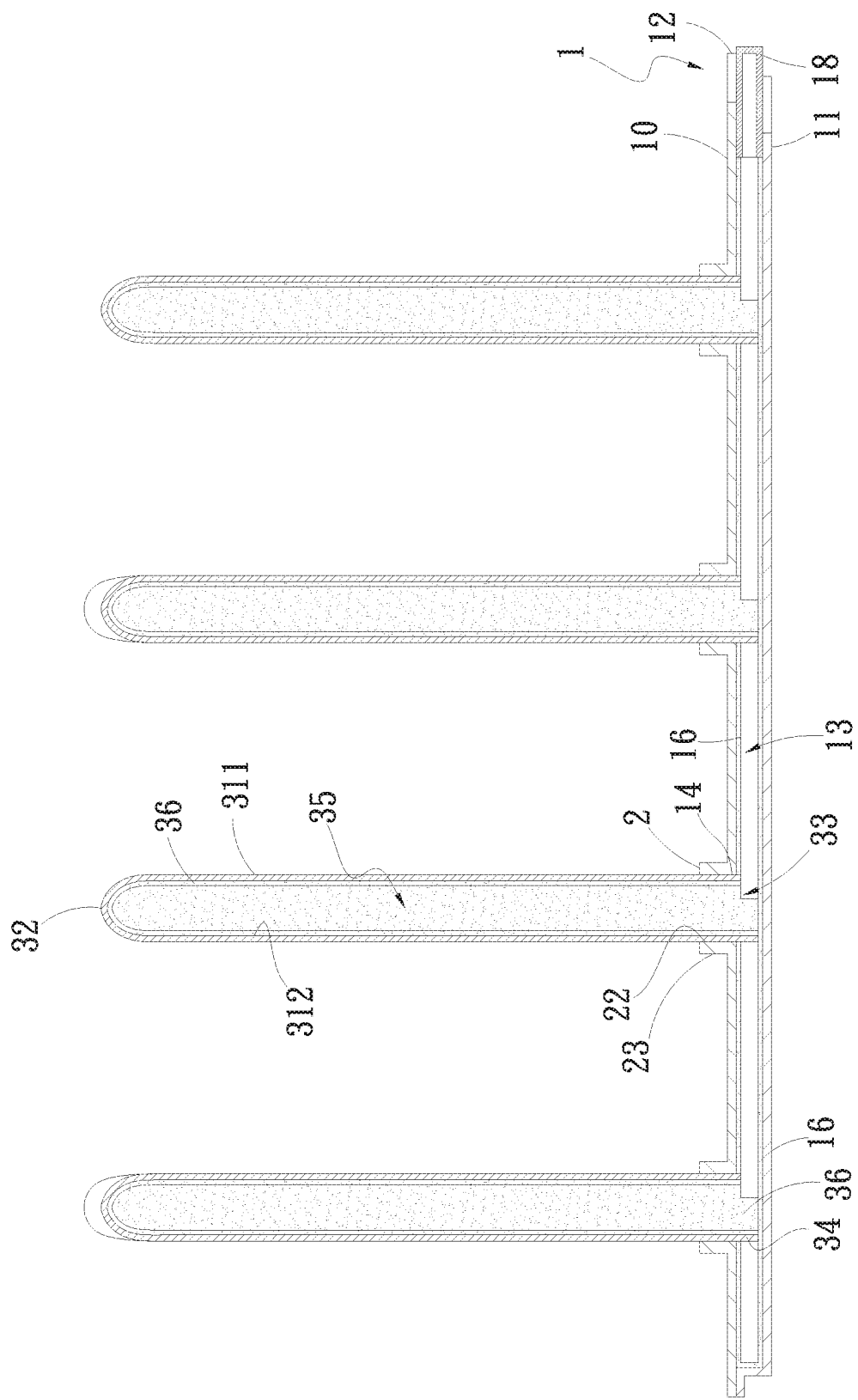

HEAT DISSIPATION UNIT CONNECTION REINFORCEMENT STRUCTURE

The present application is a division of U.S. patent application Ser. No. 15/972,233, filed on May 7, 2018.

BACKGROUND OF THE INVENTION

1. Field of the Invention

The present invention relates generally to a heat dissipation unit connection reinforcement structure, and more particularly to a heat dissipation unit connection reinforcement structure, which can increase the connection strength and connection area of the heat dissipation unit.

2. Description of the Related Art

Along with the current trend to development lighter and lighter and thinner and thinner electronic apparatuses, the sizes of the respective electronic components of the electronic apparatuses have been minified. However, the minimization of the sizes of the electronic apparatuses makes it hard to dissipate the heat generated by the electronic components. As a result, the heat generated by the electronic components has become a major obstacle to improvement of the performance of the electronic apparatuses and systems. In order to effectively solve the heat dissipation problem of the electronic components of the electronic apparatuses, many manufacturers have developed various vapor chambers and heat pipes with better heat conduction performance so as to solve the heat dissipation problem at the present stage.

A vapor chamber includes a rectangular case having an internal chamber. A working fluid is filled in the chamber and a capillary structure is disposed on the wall face of the chamber. One side (the evaporation section) of the case is attached to a heat generation component (such as a central processing unit, a Northbridge/Southbridge chipset or a transistor) to absorb the heat generated by the heat generation component. At this time, the liquid working fluid is evaporated and converted into vapor working fluid on the evaporation section of the case to transfer the heat to the condensation section of the case. The vapor working fluid is cooled and condensed into liquid working fluid on the condensation section. The liquid working fluid then flows back to the evaporation section due to gravity or capillary attraction to continue the vapor-liquid circulation. Accordingly, the heat can be spread and dissipated.

The working principle and theoretic structure of the heat pipe are identical to those of the vapor chamber. Metal powder is filled into the interior of the circular heat pipe and sintered to form an annular capillary structure on the inner wall of the heat pipe. Then the heat pipe is vacuumed and a working fluid is filled into the heat pipe. Finally, the heat pipe is sealed to form the heat pipe structure. After the liquid working fluid is heated and evaporated into vapor working fluid on the evaporation section, the vapor working fluid is spread from the evaporation section to the condensation end. At this time, the vapor working fluid is gradually cooled and condensed into liquid working fluid. Then the liquid working fluid flows back to the evaporation section through the capillary structure.

In comparison with the heat pipe, the vapor chamber only conducts heat in a manner different from the heat pipe. The vapor chamber conducts heat in a two-dimensional manner, that is, in a face-to-face manner, while the heat pipe conducts heat in a one-dimensional manner, (that is, conducts heat to a remote end to dissipate the heat). It has become insufficient to simply provide a heat pipe or a vapor chamber for the current electronic component to dissipate the heat.

It is therefore tried by the applicant to provide a heat dissipation unit connection reinforcement structure, in which the heat pipe and the vapor chamber are combined with each other and co-used to greatly enhance the heat transfer efficiency and effectively solve the heat dissipation problem of high-power electronic components.

SUMMARY OF THE INVENTION

It is therefore a primary object of the present invention to provide a heat dissipation unit connection reinforcement structure, which can increase the connection strength of the heat dissipation unit.

It is a further object of the present invention to provide the above heat dissipation unit connection reinforcement structure, which can increase the connection area of the heat dissipation unit so as to securely connect and protect the heat dissipation unit.

It is still a further object of the present invention to provide the above heat dissipation unit connection reinforcement structure, which can enhance the pressure resistance effect of the saturated vapor pressure. It is still a further object of the present invention to provide the above heat dissipation unit connection reinforcement structure, in which the heat pipe and the case communicate with each other so that a heat pipe capillary structure in the heat pipe is connected with a case capillary structure in the case to enhance the heat transfer efficiency.

To achieve the above and other objects, the heat dissipation unit connection reinforcement structure of the present invention includes a case, at least one reinforcement structure and at least one heat pipe. The case has a case chamber and at least one opening. A working fluid is contained in the case chamber. A case capillary structure is formed on an inner wall of the case chamber. The at least one opening is formed through a top side of the case in communication with the case chamber.

The at least one reinforcement structure has a reinforcement main body correspondingly disposed on the at least one opening. The reinforcement main body has a mating section, a reinforcement connection section and a connection hole formed through the reinforcement connection section. The connection hole communicates with the corresponding case chamber. The mating section horizontally outward extends from an outer circumference of the reinforcement connection section and is connected with the top side. The heat pipe has a closed end, an open end and a heat pipe chamber. The open end of the heat pipe is inserted in the corresponding connection hole. The inner circumference of the reinforcement connection section is mated with an outer side of the corresponding heat pipe. The heat pipe chamber is positioned between the open end and the closed end in communication with the case chamber through the open end. A heat pipe capillary structure is formed on an inner wall of the heat pipe chamber in connection with the corresponding case capillary structure. By means of the structural design of the present invention, the connection strength and connection area of the heat dissipation unit are effectively increased. Moreover, the present invention provides protection effect for the heat dissipation unit and has better pressure resistance.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein:

FIG. 4 is a perspective exploded view of the second embodiment of the present invention; and FIG. 4A is a sectional assembled view of the second embodiment of the present invention.

DETAILED DESCRIPTION OF THE PREFERRED EMBODIMENTS

Figure 1:
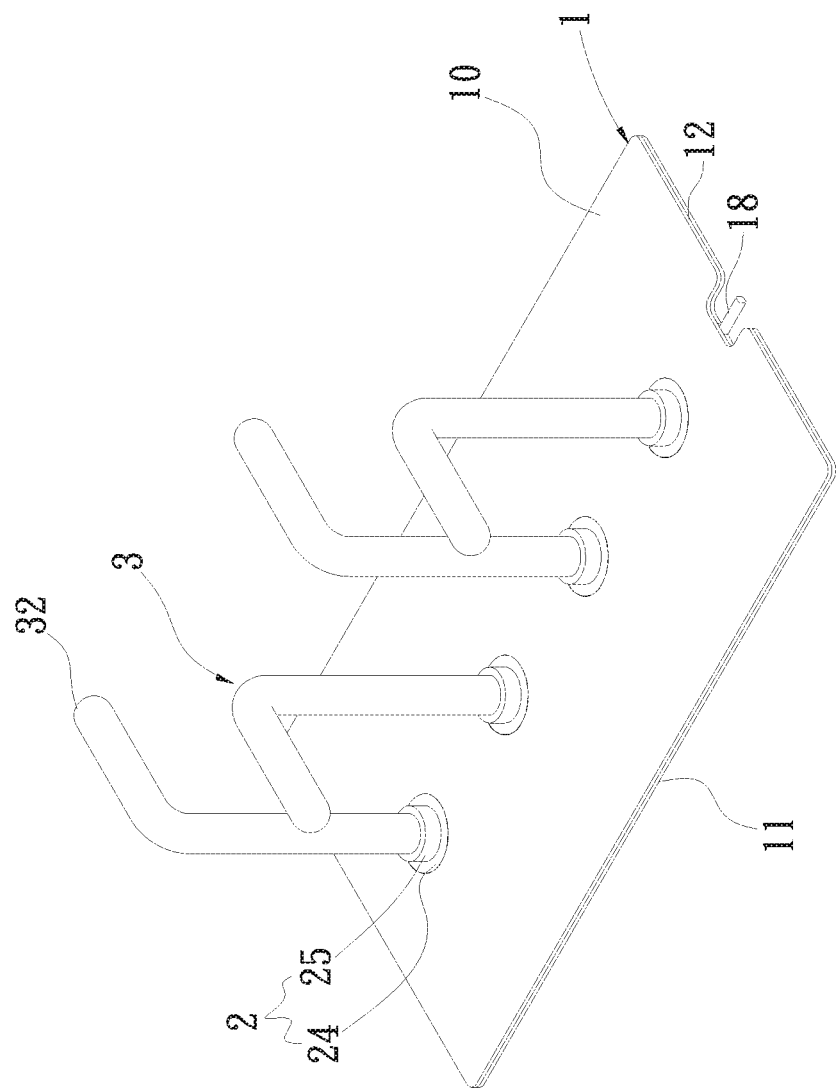
FIG. 1 is a perspective assembled view of a first embodiment of the present invention.
Figure 2:
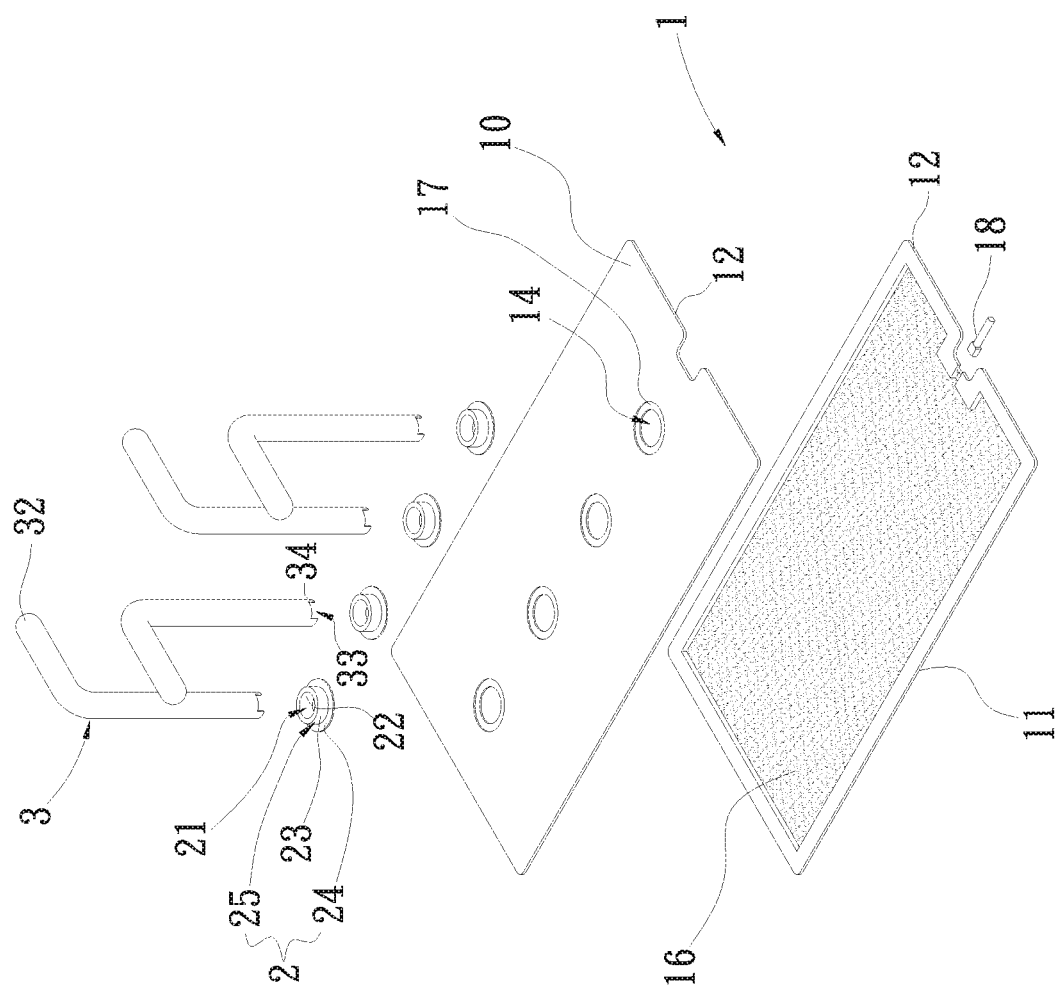
FIG. 2 is a perspective exploded view of the first embodiment of the present invention.
Figure 2A:
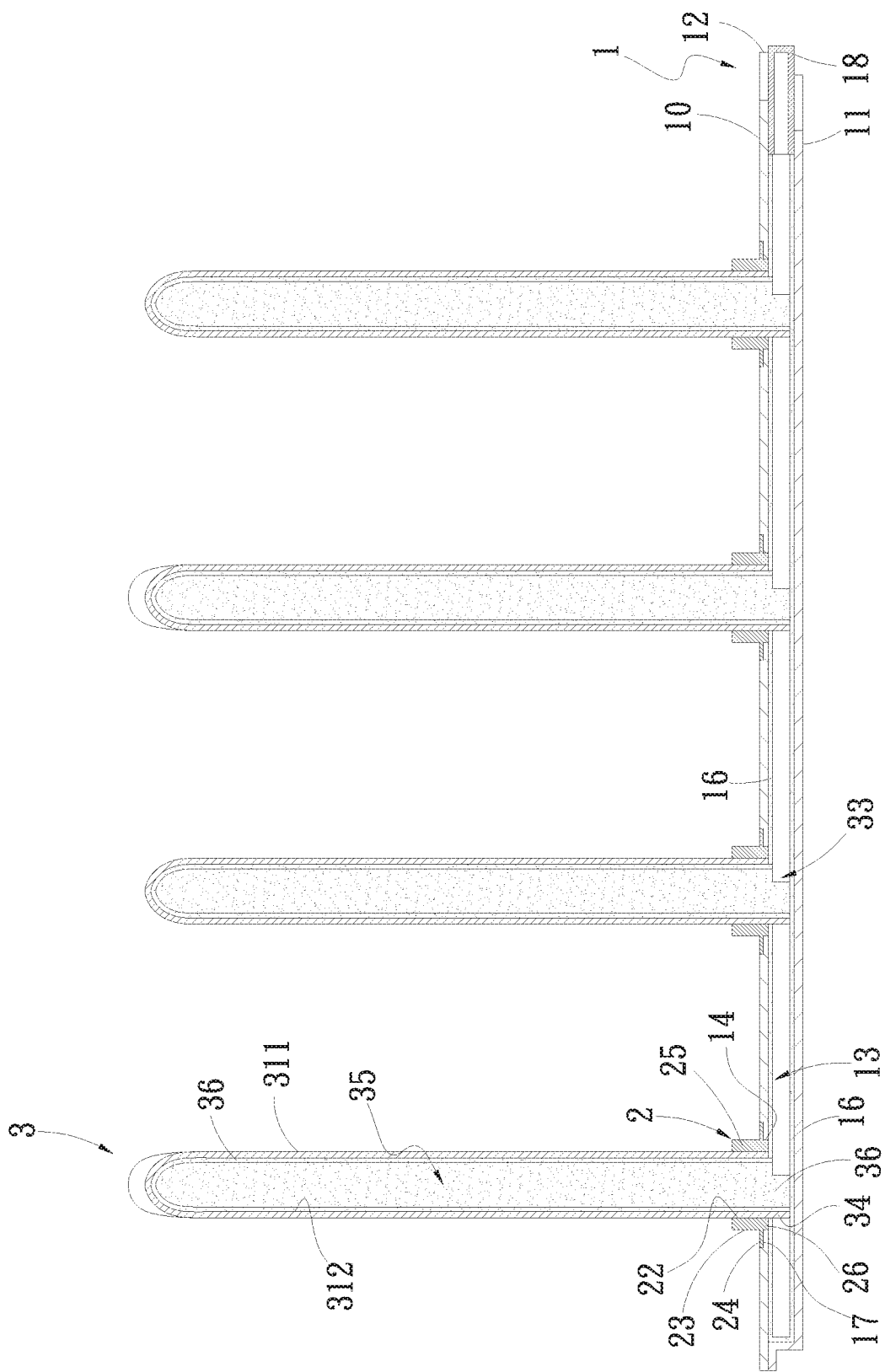
FIG. 2A is a sectional assembled view of the first embodiment of the present invention.

Please refer to FIGS. 1, 2 and 2A. FIG. 1 is a perspective assembled view of a first embodiment of the present invention. FIG. 2 is a perspective exploded view of the first embodiment of the present invention. FIG. 2A is a sectional assembled view of the first embodiment of the present invention. According to the first embodiment, the heat dissipation unit connection reinforcement structure of the present invention includes a case 1, at least one reinforcement structure and at least one heat pipe 3. In this embodiment, the case 1 is a vapor chamber, (which can be made of gold, silver, copper, aluminum, stainless steel, titanium or ceramic material). The case 1 has a top side 10, a bottom side 11, a periphery 12, a case chamber 13, a sealing tube 18 and at least one opening 14. The periphery 12 is surroundingly disposed between the top side 10 and bottom side 11 of the case 1. The sealing tube 18 passes through the periphery 12 in communication with the case chamber 13. The case chamber 13 is defined between the top side 10, the bottom side 11 and the periphery 12. A working fluid is contained in the case chamber 13. A case capillary structure 16 is formed on the inner wall of the case chamber 13. The working fluid is filled through the sealing tube 18 into the case chamber 13 of the case 1. After the working fluid is filled into the case chamber 13, the sealing tube 18 is sealed. In this embodiment, the case capillary structure 16 is, but not limited to, a sintered powder body. The case 1 can be alternatively a heat plate or a flat-plate heat pipe 3.

The opening 14 is formed through the top side 10 of the case 1 in communication with the case chamber 13. In this embodiment, there are, but not limited to, four openings 14 for illustration purposes. In practice, the number of the openings 14 can be one or more than one. The number of the openings 14 is equal to the number of the corresponding heat pipes 3. For example, one opening 14 is mated with one corresponding heat pipe 3, two openings 14 are mated with two corresponding heat pipes 3, and so on. In addition, the case 1 has at least one recessed portion 17. The recessed portion 17 is recessed on the top side 10 of the case 1 in adjacency to the opening 14. In this embodiment, there are four recessed portions 17 in accordance with the four corresponding openings 14. The reinforcement structure has a reinforcement main body 2. The reinforcement main body 2 is made of metal material (such as gold, silver, copper, aluminum, stainless steel and titanium). The reinforcement main body 2 is disposed on the corresponding opening 14. In this embodiment, there are four reinforcement main bodies 2 respectively connected on four corresponding openings 14 by means of such as welding or diffusion bonding, whereby the reinforcement main bodies 2 are integrally connected on the top side 10 of the case 1 in adjacency to the corresponding openings 14.

The reinforcement main body 2 has a connection hole 21, a mating section 24, an inner circumference 22, an outer circumference 23 and a reinforcement connection section 25. The mating section 24 horizontally outward extends from the outer circumference 23 of the reinforcement connection section 25 and is connected with the corresponding recessed portion 17 of the case 1. An upper side of the mating section 24 is flush with the adjacent top side 10 of the case 1. The connection hole 21 is formed through the reinforcement connection section 25 of the reinforcement main body 2 for the corresponding heat pipe 3 to insert in. The connection hole 21 communicates with the corresponding case chamber 13. In addition, the reinforcement main body 2 has a hub section 26 downward protruding from a bottom end of the reinforcement connection section 25. The hub section 26 is inserted with an inner circumference of the corresponding opening 14.

In this embodiment, there are four bendable heat pipes 3 for illustration purposes. Each heat pipe 3 has a closed end 32, an open end 33, a heat pipe capillary structure 36 and a heat pipe chamber 35. In this embodiment, the heat pipe capillary structure 36 a sintered powder body. The heat pipe capillary structure 36 is formed on an inner side 312 of the heat pipe 3. The heat pipe chamber 35 is positioned between the closed end 32 and the open end 33 in communication with the open end 33. The open end 33 of the heat pipe 3 is inserted in the corresponding connection hole 21 of the reinforcement main body 2, whereby the inner circumference 22 of the reinforcement connection section 25 and the inner circumference 22 of the hub section 26 of the reinforcement main body 2 are tightly attached to and connected with the outer side 311 of the corresponding heat pipe 3. The heat pipe chamber 35 communicates with the case chamber 13 through the open end 33. The case chamber 13 perpendicularly communicates with the heat pipe chamber 35. In addition, the rest parts (including the closed end 32) of the heat pipe 3 not in contact with the reinforcement main body 2 is exposed to outer side of the case 1. The heat pipe 3 is integrally connected with the reinforcement main body 2 by means of welding or diffusion bonding.

As aforesaid, the heat pipe 3 and the case 1 of the present invention are connected into an integrated body in communication with each other, whereby there is no contact interface thermal resistance between the heat pipe 3 and the case 1. Also, referring to FIG. 2A, the axial sectional thickness of the reinforcement connection section 25 of the reinforcement main body 2 is larger than the axial sectional thickness of the heat pipe 3 and the axial sectional thickness of the case 1. Therefore, the thickness of the junction between the reinforcement main body 2 and the corresponding heat pipe 3 is increased. For example, the axial sectional thickness of the reinforcement connection section 25 of the reinforcement main body 2 is such as 3.3 mm and the axial sectional thickness of the corresponding heat pipe 3 is such as 0.3 mm so that the axial sectional thickness of the junction between the reinforcement main body 2 and the corresponding heat pipe 3 is 3.6 mm. In this case, the connection strength and connection area between the reinforcement main body 2 and the heat pipe 3 can be effectively increased. In addition, in the assembling and manufacturing process and in use of the heat dissipation unit connection reinforcement structure, by means of the reinforcement main body 2, the junction is effectively prevented from being damaged and a protection effect is provided for the junction. Furthermore, when the case 1 absorbs heat, the working fluid in the case chamber 13 is heated and evaporated into vapor. At this time, by means of the design that the reinforcement main body 2 is tightly connected around the outer side 311 of the corresponding heat pipe 3, the pressure resistance requirement of the saturated vapor pressure can be enhanced. The axial sectional thickness of the reinforcement main body 2 and the reinforcement connection section 25 thereof is not limited to 3.3 mm. In practice, according to the connection strength and the pressure resistance requirement of the saturated vapor pressure, a user can adjust the axial sectional thickness of the reinforcement main body 2 and the reinforcement connection section 25 thereof. For example, the axial sectional thickness of the reinforcement main body 2 and the reinforcement connection section 25 can be 1 mm or more than 1 mm.

In a preferred embodiment, the case capillary structure 16 and the heat pipe capillary structure 36 can be alternatively selected from a group consisting of mesh body, fiber body, channeled body and complex capillary structure.

Moreover, an extension section 34 integrally outward extends from the open end 33 of the heat pipe 3. The extension section 34 extends into the case chamber 13 to directly abut against the bottom side 11 of the case chamber 13. That is, the extension section 34 downward extends from the open end 33 in the connection hole 21 toward the bottom side 11 of the case chamber 13 to connect with the bottom side 11 of the case chamber 13. In addition, a notch or an opening or a perforation is formed between the open end 33 and the extension section 34. The extension section 34 is a part of the heat pipe 3 so that the inner side of the extension section 34 is exactly the inner side 312 of the heat pipe 3. The outer side 311 of the heat pipe 3 is connected with the inner circumference 22 of the reinforcement main body 2 to form the support structure in the case chamber 13 for supporting the case chamber 13. Therefore, in the present invention, there is no copper column in the case chamber 13 for supporting the case chamber 13 as in the conventional device. Accordingly, the cost is saved.

Please now refer to FIGS. 1 and 2A. The heat pipe capillary structure 36 extends from the closed end 32 toward the open end 33 into direct connection and contact with the case capillary structure 16 of the bottom side 11 of the corresponding case chamber 13. As shown in the drawings, the heat pipe capillary structure 36 on the inner side 312 of the extension section 34 is in direct connection and contact with the case capillary structure 16 on the bottom side 11 of the case chamber 13. The heat pipe capillary structure 36 on the inner side 312 of the open end 33 of the heat pipe 3 is in direct connection and contact with the adjacent case capillary structure 16 on the top side 10 of the case chamber 13. Therefore, by means of the design that the heat pipe capillary structure 36 is in connection and contact with the case capillary structure 16, the heat transfer efficiency and heat spreading effect can be enhanced to more effectively enhance the vapor-liquid circulation efficiency.

When the outer face of the bottom side 11 of the case 1 is attached to a corresponding heat generation component (such as a central processing unit or an MCU or any other electronic component), the bottom side 11 of the case 1 will absorb the heat generated by the heat generation component. At this time, the working fluid on the case capillary structure 16 on the bottom side 11 of the case chamber 13 is heated and evaporated into vapor working fluid (or so-called vapor-phase working fluid). The vapor working fluid will flow in a direction to the top side 10 of the case chamber 13. Also, part of the vapor working fluid will pass through the open end 33 of the heat pipe 3 to flow into the heat pipe chamber 35. Then, the vapor working fluid is condensed on the top side 10 of the case chamber 13 and the closed end 32 of the heat pipe chamber 35 and converted into cooled working fluid (or so-called liquid-phase working fluid). At this time, by means of the capillary attraction of the heat pipe capillary structure 36, the cooled working fluid on the closed end 32 of the heat pipe chamber 35 quickly flows back to the case capillary structure 16 on the bottom side 11 of the case chamber 13. Therefore, the working fluid is continuously vapor-liquid circulated within the case chamber 13 and the heat pipe chamber 35 to achieve better heat dissipation effect.

Figure 3:
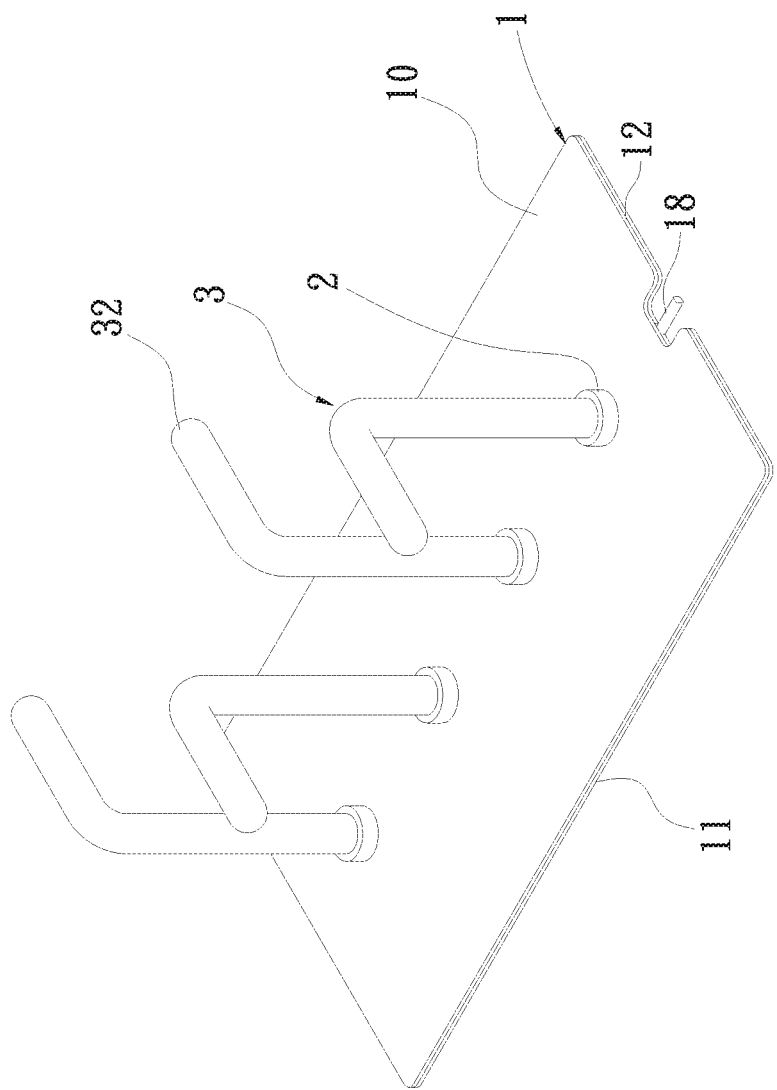
FIG. 3 is a perspective assembled view of a second embodiment of the present invention.

Please now refer to FIGS. 3, 4A and 4B. FIG. 3 is a perspective assembled view of a second embodiment of the present invention. FIG. 4 is a perspective exploded view of the second embodiment of the present invention. FIG. 4A is a sectional assembled view of the second embodiment of the present invention. The structure and connection relationship and effect of the case 1, the heat pipe 3 and the reinforcement main body 2 of the second embodiment are substantially identical to the structure and connection relationship and effect of the case 1, the heat pipe 3 and the reinforcement main body 2 of the first embodiment and thus will not be redundantly described hereinafter. In the second embodiment, the top side 10 of the case 1 is free from the recessed portion 17 and the reinforcement main body 2 (including the reinforcement connection section 25, the mating section 24 and the hub section 26). Instead, the case 1 is such redesigned that the reinforcement main body 2 is a part of the case 1 itself, (that is, the reinforcement main body 2 and the case 1 are integrally formed). As shown in the drawings, the reinforcement main body 2 upward extends from the top side 10 of the case 1 in adjacency to the periphery of the opening 14. The open end 33 of the heat pipe 3 is inserted in the corresponding connection hole 21 and the opening 14 in communication with the opening 14. Accordingly, the inner circumference 22 of the reinforcement main body 2 and the inner circumference of the opening 14 are tightly connected (or attached) to the outer side 311 of the corresponding heat pipe 3.

The present invention has been described with the above embodiments thereof and it is understood that many changes and modifications in such as the form or layout pattern or practicing step of the above embodiments can be carried out without departing from the scope and the spirit of the invention that is intended to be limited only by the appended claims.

What is claimed is:

1. A heat dissipation unit connection reinforcement structure comprising:
   a case having a case chamber, at least one recessed portion recessed on a top side of the case, and at least one opening formed through the at least one recessed portion and in fluid communication with the case chamber,
   a working fluid contained in the case chamber,
   a case capillary structure formed on an inner wall of the case chamber;
   at least one reinforcement structure having a reinforcement main body correspondingly disposed on the at least one opening, the reinforcement main body having a mating section, a reinforcement connection section, and a connection hole formed through the reinforcement connection section, the connection hole communicating with the case chamber, the mating section horizontally outward extending from an outer circumference of the reinforcement connection section and connected with the at least one recessed portion on the top side of the case, wherein the reinforcement main body and the case are made of different materials and are connected with each other by means of welding or diffusion bonding, the reinforcement main body having a hub section downward protruding from a bottom end of the reinforcement connection section and inserted into the at least one opening and terminating at the case capillary structure; and at least one heat pipe, the at least one heat pipe having a closed end, an open end, and a heat pipe chamber, the open end of the at least one heat pipe being inserted in the connection hole, an inner circumference of the reinforcement connection section being tightly attached to an outer side of the at least one heat pipe, the heat pipe chamber being positioned between the open end and the closed end in communication with the case chamber through the open end, a heat pipe capillary structure being formed on an inner side of the at least one heat pipe in connection with the case capillary structure in the case chamber.

2. The heat dissipation unit connection reinforcement structure as claimed in claim 1, wherein an upper side of the mating section is flush with the top side of the case.

3. The heat dissipation unit connection reinforcement structure as claimed in claim 2, wherein an inner circumference of the hub section being attached to and connected with the outer side of the corresponding heat pipe.

4. The heat dissipation unit connection reinforcement structure as claimed in claim 1, wherein an extension section integrally outward extends from the open end of the heat pipe into the case chamber to directly abut against the bottom side of the case chamber, the heat pipe capillary structure extending from the closed end toward the open end into direct connection and contact with the case capillary structure of the bottom side of the case chamber.

5. The heat dissipation unit connection reinforcement structure as claimed in claim 4, wherein the heat pipe capillary structure on the inner side of the open end of the heat pipe is in connection with an adjacent case capillary structure on the top side of the case chamber and the heat pipe capillary structure on the inner side of the extension section is in connection with the adjacent case capillary structure on the bottom side of the case chamber.

6. The heat dissipation unit connection reinforcement structure as claimed in claim 4, wherein a notch is formed between the open end and the extension section.

7. The heat dissipation unit connection reinforcement structure as claimed in claim 1, wherein the case is a vapor chamber or a heat plate.

8. The heat dissipation unit connection reinforcement structure as claimed in claim 1, wherein the reinforcement main body is made of metal material.

9. The heat dissipation unit connection reinforcement structure as claimed in claim 1, wherein the case has a bottom side, a periphery and a sealing tube, the periphery being surroundingly disposed between the top side and the bottom side, the sealing tube passing through the periphery in communication with the case chamber.

\* \* \* \* \*